(12) United States Patent
Yudasaka

(10) Patent No.: US 6,881,501 B2
(45) Date of Patent: *Apr. 19, 2005

(54) ORGANIC ELECTRO-LUMINESCENCE ELEMENT AND THE MANUFACTURING METHOD THEREOF

(75) Inventor: Ichio Yudasaka, Chimo (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 162 days.

(21) Appl. No.: 09/803,034

(22) Filed: Mar. 12, 2001

(65) Prior Publication Data

US 2002/0022148 A1 Feb. 21, 2002

(30) Foreign Application Priority Data

Mar. 13, 2000 (JP) ........................................ 2000-069395

(51) Int. Cl.⁷ ............................................... H05B 33/00
(52) U.S. Cl. ....................... 428/690; 428/917; 428/156; 428/213; 313/504; 313/505; 257/91; 257/99; 427/66
(58) Field of Search ................................ 428/690, 917, 428/156, 213; 313/504, 505; 257/91, 99; 427/66

(56) References Cited

U.S. PATENT DOCUMENTS

| | | | | |
|---|---|---|---|---|
| 4,670,690 A | * | 6/1987 | Ketchpel | 313/505 |
| 4,963,788 A | * | 10/1990 | King et al. | 313/503 |
| 5,994,836 A | * | 11/1999 | Boer et al. | 313/504 |
| 6,046,543 A | * | 4/2000 | Bulovic et al. | 313/504 |
| 6,157,127 A | * | 12/2000 | Hosokawa et al. | 313/506 |
| 6,433,487 B1 | * | 8/2002 | Yamazaki | 315/169.3 |

FOREIGN PATENT DOCUMENTS

| JP | 08-357028 | * | 7/1998 |
|---|---|---|---|
| JP | A-11-214163 | | 8/1999 |

* cited by examiner

*Primary Examiner*—Dawn Garrett
(74) *Attorney, Agent, or Firm*—Oliff & Berridge PLC (57) ABSTRACT

The invention increases the outgoing efficiency of light generated in an organic luminous layer of an organic electroluminescence element without decreasing the numerical aperture. A light-transmissive anode electrode layer, an organic luminous layer, and a light-reflective cathode layer are provided on the entire surface of one pixel region. On the anode layer, the organic luminous layer, and the cathode layer, slopes are installed protruding from the anode layer side to the cathode layer side. By this, light generated in the organic luminous layer, and irradiated in parallel to a cumulate surface of a cumulate body, is reflected by the slope on the boundary between the organic luminous layer and the cathode layer and exits toward the anode layer side.

10 Claims, 12 Drawing Sheets

ORGANIC ELECTRO-LUMINESCENCE ELEMENT AND THE MANUFACTURING METHOD THEREOF

BACKGROUND OF THE INVENTION

1. Field of Invention

The present invention relates to an organic electroluminescence element which is excellent in the output efficiency of light generated in the organic luminous layer.

2. Description of Related Art

Organic electroluminescence displays which are equipped with organic electroluminescence elements (elements having an organic luminous layer between the cathode and the anode) corresponding to the respective pixels have high brightness with spontaneous light. The organic electroluminescence displays can be driven with direct current at low voltage, have a high speed response, and have light generated by a solid organic film. Thus, the organic electroluminescence displays are excellent in display performance and enabling thickness reduction, weight reduction, and electricity consumption reduction. The organic electroluminescence displays are therefore expected to replace liquid crystal displays in the future.

In an organic electroluminescence display, a large number of pixels, formed of organic electroluminescence elements, are placed in a matrix, that is formed of rows and columns intersecting at right angles. The active matrix method and the passive matrix method are methods of driving organic electroluminescence displays.

In the passive matrix method, patterning is performed by enabling one of the two electrodes, which sandwich an organic luminous layer, correspond to the row and the other to the columns. A pixel formed of an organic electroluminescence element is formed in the position where the two electrodes overlap. Also, because the row electrode and the column electrode correspond to the scanning line and the data line, and the ON state is made by selecting one row electrode and one column electrode, only the pixel in the position where both electrodes are simultaneously in the ON state emits light.

On the other hand, in the active matrix method, one electrode (the pixel electrode) and the organic luminous layer are formed in a matrix shape. The other electrode is formed over the entire surface of the display as the common electrode, and each pixel is equipped with a driving transistor and a capacitor. Therefore, an active matrix type organic electroluminescence display enables higher definition at high brightness, and is therefore able to deal with increases in gray scales and display size.

Figure 9:
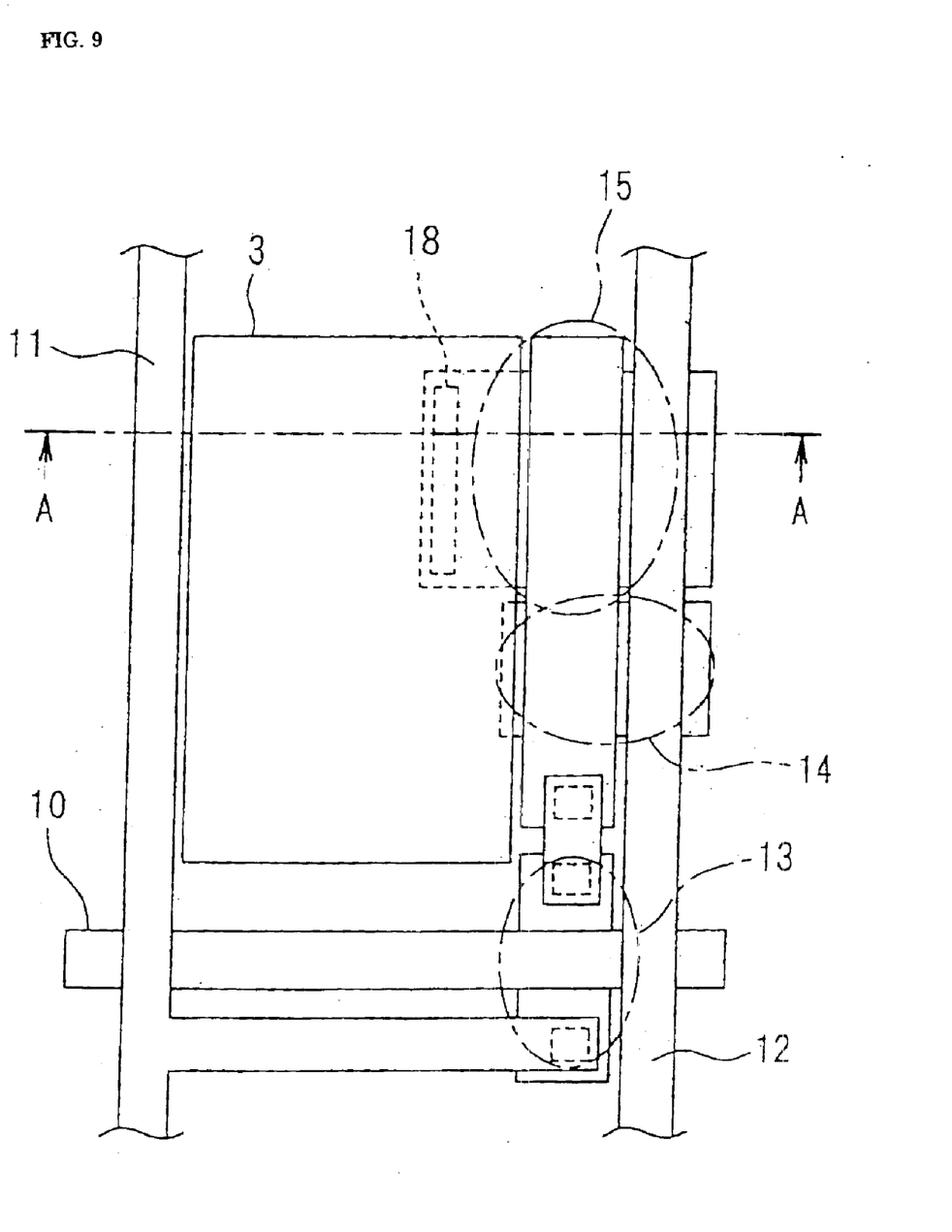
FIG. 9 is a partial plan view showing an example of the conventional active matrix type organic electroluminescence display, which shows one pixel and the driving elements, etc., arranged around the pixel.
Figure 10:
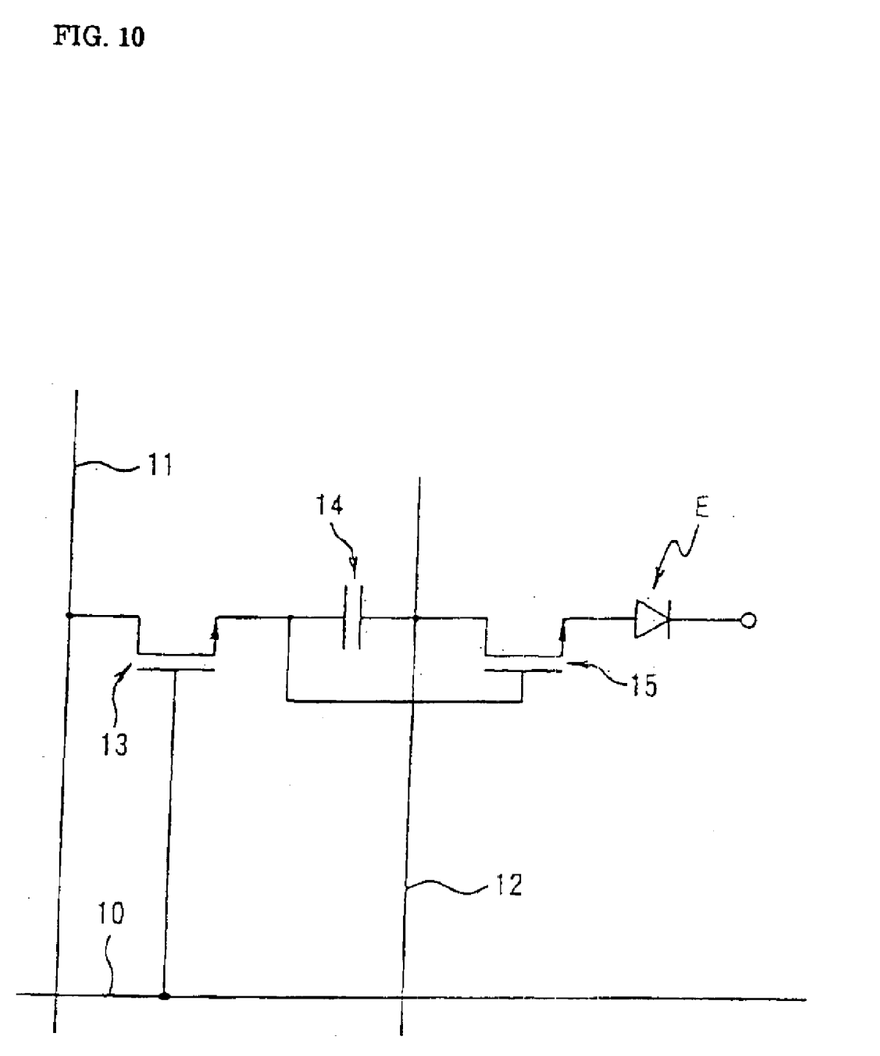
FIG. 10 ia a circuit diagram showing an example of the conventional active matrix type organic electroluminescence display, which shows a circuit for driving one pixel.
Figure 11:
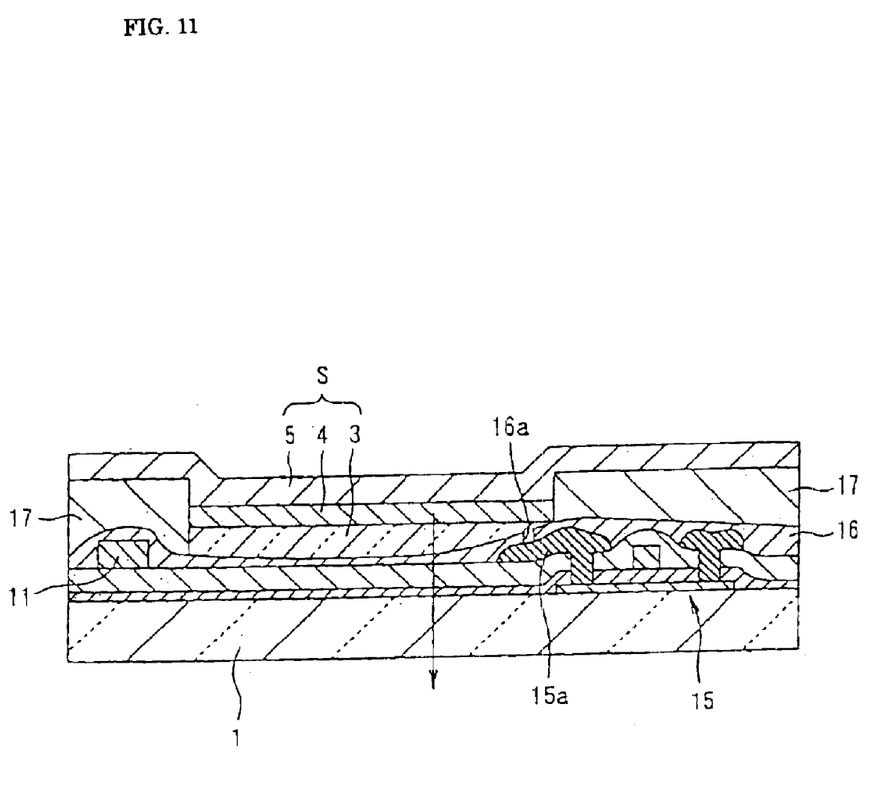
FIG. 11 is a sectional view taken along plane A—A of FIG. 9.

An explanation is provided of an example of active matrix type organic electroluminescence displays discussed above with reference to FIGS. 9–11. FIG. 9 is a partial plane view, showing one pixel and its driving element, etc., that surrounds the pixel. FIG. 10 shows a circuit for driving one pixel of the display. FIG. 11 is a cross-sectional view taken along plane A—A of FIG. 9.

As shown in FIGS. 9 and 10, in this active matrix type organic electroluminescence display, each pixel, formed of an organic electroluminescence element E, is equipped with a switching transistor 13, a capacitor 14, and a driving transistor 15. These elements are connected to the driving circuit via a scanning line 10, a signal line 11, and a common line 12. In this active matrix type organic electroluminescence display, a pixel is selected by a switching transistor 13. An organic electroluminescence element E, which is the pixel, which permits the emission of light at a preset brightness by a driving transistor 15.

As shown in FIG. 11, on a glass substrate 1 of this display, after each driving element, including a signal line 11 and the driving transistor 15, are formed, an insulating layer 16 is formed. In this insulating layer 16, a contact hole 16a is formed on the position of the source/drain electrode 15a of the driving transistor 15. Also, a bank 17 is formed on the insulating layer 16. The bank 17 divides the substrate surface into pixels.

In the pixel area divided by this bank 17, an anode layer (light-transmissive electrode layer) 3 and an organic luminous layer 4 are formed. Further, a cathode layer (light-reflective electrode layer) 5 is formed on the entire substrate above the bank 17 and organic luminous layer 4. When forming the anode layer 3, the contact hole 16a is filled with the component material (conductor) of the anode layer 3, connecting the source/drain electrode 15a and the anode layer 3. In FIG. 9, a conductor (connecting plug) filled in this contact hole 16a is indicated by the reference number 18.

Enhancing luminous efficiency of the organic electroluminescence element is an effective technique to reduce consumption of electricity by an organic electroluminescence display, irrespective of the difference in driving methods. Efficiency is enhanced by enhancing the raw materials and their combination in each layer of the hall transport layer and/or the electron transport layer between the organic luminous layer and electrode layer.

Figure 12:
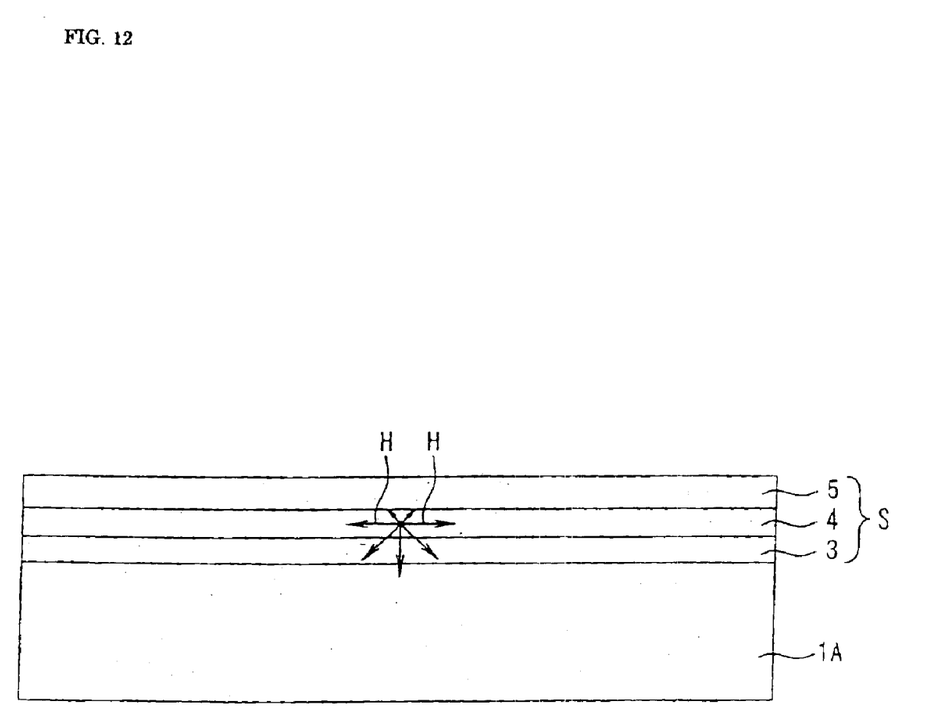
FIG. 12 is a sectional view of a conventional organic electroluminescence element, which shows behavior of light generated in the organic luminous layer.

Also, as shown in FIG. 12, light generated in the organic luminous layer 4 radiates in all directions. Then, the light irradiated straight toward the side of the glass substrate 1A, and a part of the light reflected by the interface between the light-reflective electrode layer (cathode layer) 5 and the organic luminous layer 4, emerge toward the side of the glass substrate 1A. As shown in FIG. 12, in a cumulate body where the whole cumulate surface is flat, light H irradiated in parallel with the cumulate surface of the cumulate body S travels toward the end surface of the organic luminous layer 4 (the surface in contact with the inner wall of the bank 17 in FIG. 11) and does not emerge toward the side of the glass substrate 1A.

As a result, outgoing efficiency of light generated in the organic luminous layer 4 (ratio of light quantity emerging to the side of the glass substrate 1A to the total emission quantity in the organic luminous layer 4) is approximated as being about 20%, for example. Therefore, increasing outgoing efficiency of light generated in the organic luminous layer 4 becomes important for reducing consumption of electricity by the organic electroluminescence display.

Japanese Patent Publication Hei 11-214163 discloses that outgoing efficiency of light generated in an organic luminous layer is increased by reflecting, in the direction perpendicular to the substrate surface the light outgoing in a horizontal direction relative to the substrate surface, by installing many holes in one electrode layer and installing slopes on the other electrode utilizing these holes.

SUMMARY OF THE INVENTION

However, in the method described in the above publication, because electrode area actually decreases by installing holes in one electrode layer, the numerical aperture of the organic electroluminescence display decreases. Decrease in numerical aperture leads to a decrease in luminous efficiency. Therefore, the method described in the above publication can be enhanced in terms of reducing the consumption of electricity of the organic electroluminescence display.

It is therefore an object of the present invention to increase the output efficiency of light generated in an organic luminous layer of an organic electroluminescence element.

In order to solve the problem, the present invention provides an organic electroluminescence element that is equipped with a cumulate body having a cathode layer, an anode layer, and one or more organic thin film layer containing an organic luminous layer placed between the cathode layer and the anode layer. The cathode layer and the anode layer have slopes.

Because light generated in the organic luminous layer of such an organic electroluminescence element is reflected by one of the slopes of the cathode layer or the anode layer, the organic electroluminescence element provides a structure for light to be guided out to the observation side efficiently.

As the raw material forming the anode layer, for example, ITO, platinum, nickel, iridium, and palladium can be used, and in some cases, it can be a cumulate film containing a mixture of these materials. As the raw material forming the cathode layer, for example, gold, magnesium-silver, lithium oxide-aluminum, and lithium fluoride-aluminum can be used, and in some cases, it can be a cumulate film containing a mixture of these materials, such as a cumulate film of lithium fluoride and aluminum, or a cumulate film of lithium oxide and aluminum. If the electrode film thickness and material are appropriately selected to provide a light-transmissive electrode, light can be extracted from either side of the cathode layer or the anode layer.

For example, according to the organic electroluminescence element, at least a part of light generated in the organic luminous layer, and irradiated in parallel, or alternatively almost in parallel, to the cumulate surface of the cumulate body, is mainly reflected by a slope on the boundaries between the light-reflective electrode layer and the organic luminous layer, exits in the light-transmissive electrode layer side.

Because the area of the both electrode layers and the organic luminous layer of the organic electroluminescence element can be increased by installing slopes, emission quantity can be increased compared to the case where the whole cumulate surface is flat.

If slopes are made on the rim sections of the pixels, light generated in the pixel section becomes more easily reflected by the slopes made on the rim sections, making the outgoing light efficiency higher. Therefore, in the organic electroluminescence element of the present invention, it is preferable that the slopes be formed on the rim sections within the area.

In the parallel irradiated light, if the quantity of light reflected by the slopes on the boundaries becomes larger, then the projection of the organic luminous layer by the slopes becomes higher. Therefore, in the organic electroluminescence element of the present invention, it is preferable that the protruding height of the organic luminous layer by the slopes be higher than the thickness of the organic luminous layer, and larger than the total of the thickness of the light-transmissive electrode layer and the thickness of the organic luminous layer.

In the organic electroluminescence element of the present invention, it is preferable that multiple slopes be formed in a uniform arrangement in the surface. By so doing, there is greater uniformity in the area of the quantity of light that is reflected by the slopes of the boundaries, and that exits to the light-transmissive electrode layer side.

In the organic electroluminescence element of the present invention, the slopes can be formed by making projections, made of insulating material, on the substrate that forms the cumulate body. Also, the projections can be formed by making the electrode layer formed, on the substrate side where the cumulate body is formed, in the shape having convex sections corresponding to the slopes.

The present invention also provides, as a method of manufacturing the organic electroluminescence element of the present invention, a method including the following steps:

forming an insulating film on a substrate where the cumulate body is formed;

forming projections made of insulating material on the parts corresponding to the slopes on the substrate by patterning the insulating film;

forming one electrode layer (an anode layer or a cathode layer) on the substrate where the projection is formed;

forming an organic luminous layer on the electrode layer; and forming the other electrode layer (a cathode layer or an anode layer) on the organic luminous layer.

In the method of the present invention, the projection is preferably formed by the following steps:

forming a first insulating film on the substrate;

forming on the first insulating film a second insulating film made of a different material from the first insulating film; and patterning the second insulating film.

The present invention also encompasses a method of manufacturing the organic electroluminescence element that includes the following steps:

forming one electrode layer (an anode layer or a cathode layer) on the substrate where the cumulate body is formed so that the electrode layer is placed on the whole surface of the area and has convex sections on the parts corresponding to the slopes;

forming an organic luminous layer on the electrode layer; and forming the other electrode layer (a cathode layer or an anode layer) on the organic luminous layer.

In this method, if one of the electrode layers (the anode layer or the cathode layer) is a light-transmissive electrode layer, the electrode layer can be formed in the following steps:

forming on the substrate a first thin film made of a light-transmissive, conductive material by spluttering;

forming a second thin film made of a light-transmissive, conductive material by forming a coating of liquid containing light-transmissive, conductive materials on the first thin film and then removing the solvent in the coating; and forming convex sections by patterning and then baking the second thin film.

BRIEF DESCRIPTION OF THE DRAWINGS

FIGS. 7(a) and 7(b) show an example of the arrangement method for uniformly arranging multiple slopes within the surface of one pixel region, wherein FIG. 7(a) is a plan view, and FIG. 7(b) is a sectional view taken along plane B—B of FIG. 7(a);

FIGS. 8(a) and 8(b) show an example of the arrangement method for uniformly arranging multiple slopes within the surface of one pixel region, wherein FIG. 7(a) is a plan view, and FIG. 7(b) is blown-up view showing a part of FIG. 7(a);

DETAILED DESCRIPTION OF PREFERRED EMBODIMENTS

Explanations are given hereafter of embodiments of the present invention.

Figure 1:
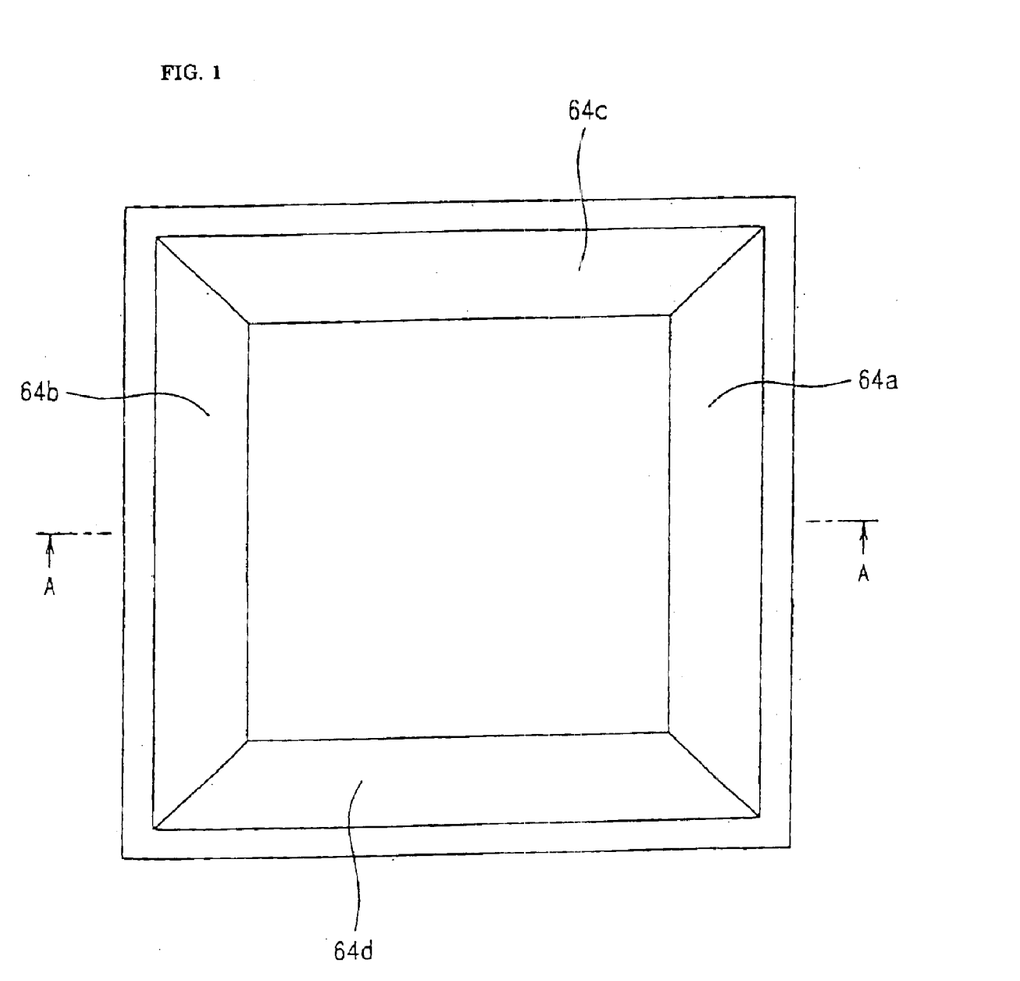
FIG. 1 is a plan view showing the interior of one pixel region of an organic electroluminescence display in accordance with the first to third embodiments of the invention.
Figure 2:
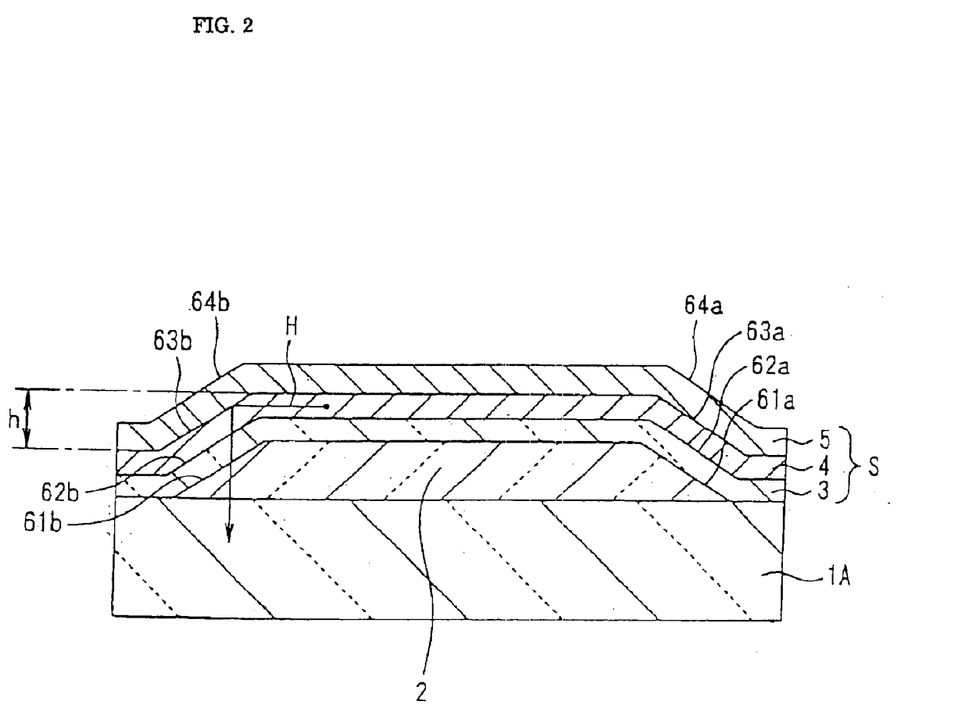
FIG. 2 is a sectional view showing a configuration of the organic electroluminescence display in accordance with the first embodiment taken along plane A—A line of FIG. 1.

FIGS. 1 and 2 provide an explanation of an organic electroluminescence display corresponding to the first embodiment of the organic electroluminescence element of the present invention. FIG. 1 is a plan view showing an area (an area corresponding to the pixel region divided by the bank 17 in FIG. 11) of the organic electroluminescence display, and FIG. 2 is a sectional view taken along plane A—A of FIG. 1. FIG. 2 shows a glass substrate 1A in the state just before a cumulate body S is formed (a state where many kinds of driving elements are formed on the glass substrate, and the bank 17 is formed).

On the glass substrate 1A, a cumulate body S is formed via a projection 2 made of a light-transmissive insulating material. This projection 2 is formed by forming a thin film made of light-transmissive materials, such as silicon dioxide ($SiO_2$) and silicon nitride ($Si_3N_4$), on the glass substrate 1A, by the plasma CVD method or the sputtering method, at 400 nm in thickness, for example, and then patterning the thin film. This patterning is performed by forming a resist pattern on the thin film and then etching it.

By this patterning, rim sections of the pixel areas of the thin film are removed by the specified width, so that four sides of the projection 2 are made into slopes 61 in a tapered shape that becomes narrower toward the edges of the glass substrate 1A. As the result, four slopes 61 forming the sides of the projection 2 are formed in the rim section of the pixel region. Here, in FIG. 2, which is the sectional view, only two slopes 61a and 61b are shown.

A cumulate S is formed of an anode layer (a light-transmissive electrode layer) 3 made of ITO ($In_2O_3$—$SnO_2$), an organic luminous layer 4, and a metallic cathode layer (a light-reflective electrode layer) 5. Thin films forming these layers 3–5 are formed one by one on the glass substrate 1A after a projection 2 is formed. By this, slopes 62–64 are formed on the section of four slopes 61a and 61b of the projection 2 on each of the layers 3–5. The slopes 62–64 protrude from the anode layer 3 side to the cathode layer 5 side. Also, the slopes 62–64 are formed on the rim section side of the pixel region.

Here, in FIG. 2, which is a sectional view, only two slopes, 62a–64a and 62b–64b, are displayed. In FIG. 1, which is a plan view, four slopes 64a–64d of the cathode layer 5 are shown.

The anode layer 3, made of ITO, is formed by the sputtering method, for example. The organic luminous layer 4 is made, for example, in the two-layer structure having a hole transport layer in the anode layer 3 side,or the three-layer structure having an additional electron transport layer in the cathode layer 5 side. The organic luminous layer 4 is formed by the vapor coating method, etc., when using low polymer materials, and is formed by the spin coat method, the inkjet method, etc., when using high polymer materials.

The cathode layer 5 is formed, for example, by the vapor coating method, etc., using aluminum (Al) with calcium (Ca) or magnesium (Mg), or materials containing alkali metals, such as lithium (Li).

In this embodiment, the thickness of the anode layer 3 is set to 100 nm, the thickness of the organic luminous layer 4 is set to 200 nm, and the thickness of the projection 2 is set to 400 nm, which is larger than 300 nm, which is the total thickness of the anode layer 3 and the organic luminous layer 4. Thus, the protruding height of the organic luminous layer 4 by the slope 63 becomes larger than the total size of the thickness of the cathode layer 3 and the thickness of the organic luminous layer 4.

Therefore, according to the organic electroluminescence element of this embodiment, light H generated in the organic luminous layer 4, and irradiated in parallel to the cumulate surface of the cumulate body S, is mainly reflected by the slope 63 on the boundary between the organic luminous layer 4 and the cathode layer 5, and exits to the anode layer 3 side. By this, the outgoing efficiency of light generated in the organic luminous layer 4 to the anode layer 3 side can be increased without decreasing the size of the aperture. Here, by setting slope 45° to 63°, the quantity of light that is reflected by this slope 63 and that exits the anode layer 3 side can be maximized.

Also, in this organic electroluminescence element, because both of the electrode layers 3 and 5 and the organic luminous layer 4 have slopes that exist over the whole surface in the pixel region, areas of the two electrode layers 3 and 5 and the organic luminous layer 4 increase, and the emission quantity increases correspondingly compared with organic electroluminescence elements equipped with cumulate bodies whose whole surface of the cumulate layer is flat.

Figure 3:
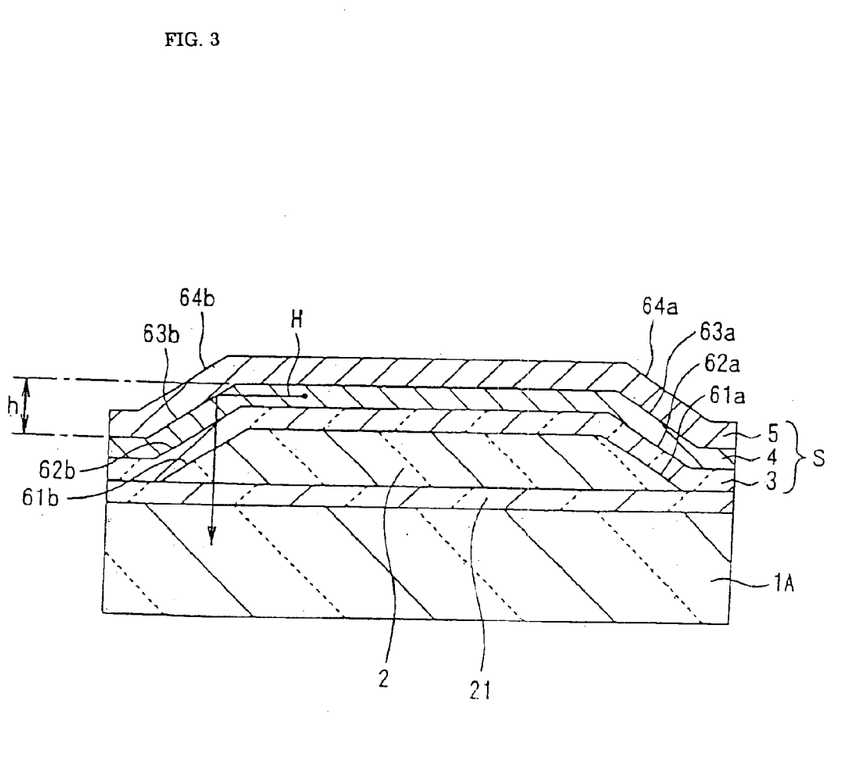
FIG. 3 is a sectional view showing a configuration of the organic electroluminescence display in accordance with the second embodiment taken along plane A—A of FIG. 1.

FIGS. 1 and 3 provide an explanation of an organic electroluminescence display corresponding to the second embodiment of the organic electroluminescence element of the present invention. FIG. 1 is a plan view showing an area (an area corresponding to the pixel region divided by the bank 17 in FIG. 11) of this organic electroluminescence display, and FIG. 3 is a sectional view taken along plane A—A of FIG. 1. FIG. 3 shows a glass substrate in the state just before a cumulate body S is formed (a state where many kinds of driving elements are formed on the glass substrate, and the bank 17 is formed).

On this glass substrate 1A, a cumulate body S is formed via a projection 2. The projection 2 is made of an insulating material different from the first insulating film 21 or the first glass substrate 1A. The first insulating film 21 is made of silicon nitride ($Si_3N_4$), and the projection 2 is made of silicon dioxide ($SiO_2$).

The first insulating film 21 is made by the plasma CVD method with a thickness of 100 nm, for example. The projection 2 is formed by forming a silicon dioxide thin film (the second insulating film) with a thickness of 300 nm, for example, and then patterning this thin film. This patterning is performed by forming a resist pattern on the thin film, and then etching it with a fluorine-system etching liquid, for example.

By this patterning, the rim sections of the pixel areas of the thin film are removed by a specified width, so that four sides of the projection 2 are made into slopes 61 in a tapered shape that becomes narrower toward the edges of the glass substrate 1A. As the result, four slopes 61 forming the sides of the projection 2 are formed in the rim section of the pixel region. Here, in FIG. 3, which is a sectional view, only two slopes 61a and 61b are shown.

A cumulate S is formed of an anode layer (a light-transmissive electrode layer) 3 made of ITO ($In_2O_3$—$SnO_2$), an organic luminous layer 4, and a metallic cathode layer (a light-reflective electrode layer) 5. Thin films forming these layers 3–5 are formed one by one on the glass substrate 1A after a projection 2 is formed. By this, slopes 62–64 are formed on the section of four slopes 61 of the projection 2 on each of the layers 3–5. These slopes 62–64 protrude from the anode layer 3 side to the cathode layer 5 side. Also, the slopes 62–64 are formed on the rim section side of the pixel region.

Here, in FIG. 3, which is a sectional view, only two slopes, 62a–64a and 62b–64b are displayed. In FIG. 1, which is a plan view, four slopes 64a–64d of the cathode layer 5 are shown.

The methods for configuring and forming method of the layers 3–5 are the same as those used in the first embodiment, except for the setting of the thickness of the organic luminous layer 4 to 100 nm. Specifically, in this embodiment, the thickness of the anode layer 3 is set to 100 nm, the thickness of the organic luminous layer 4 is set to 100 nm, and the thickness of the projection 2 is set to 300 nm, which is larger than 200 nm, which is the total thickness of the anode layer 3 and the organic luminous layer 4. Thus, the protruding height of the organic luminous layer 4 by the slope 63 becomes larger than the total size of the thickness of the cathode layer 3 and the thickness of the organic luminous layer 4.

Therefore, according to the organic electroluminescence element of this embodiment, light H generated in the organic luminous layer 4, and irradiated in parallel to the cumulate surface of the cumulate body S, is mainly reflected by the slope 63, and exits to the anode layer 3 side. By this, outgoing efficiency of light generated in the organic luminous layer 4 to the anode layer 3 side can be increased without decreasing the size of the aperture. Here, by setting slope 45° to 63°, quantity of light that is reflected by this slope 63 and that exits to the anode layer 3 side can be maximized.

Also, in this organic electroluminescence element, because both of the electrode layers 3 and 5 and the organic luminous layer 4 have slopes that extend over the whole surface in the pixel region, areas of the two electrode layers 3 and 5 and the organic luminous layer 4 increase, and the emission quantity increases correspondingly amount compared with organic electroluminescence elements equipped with cumulate bodies whose whole surface of the cumulate layer is flat.

Further, in this embodiment, formation of the projection 2 to provide slopes is performed by continuously forming the first insulating film 21, made of silicon nitride, and the second insulating film, made of silicon oxide, and then wet-etching the second insulating film with a fluorine-system etching liquid. The etching speed by fluorine-system etching liquid should be high with silicon oxide, which is the material of the second insulating film, and low with silicon nitride, which is the material of the first insulating film 21.

Therefore, because the first insulating film becomes more resistant to overetching by etching with fluorine-system etching liquid of the second insulating film, the protruding height of the projection 2 can be easily made to be the same with the thickness of the second insulating film. Therefore, by forming the second insulating film to the same thickness with the protruding height of the projection 2, the protruding height of the projection 2 can be easily controlled.

Figure 4:
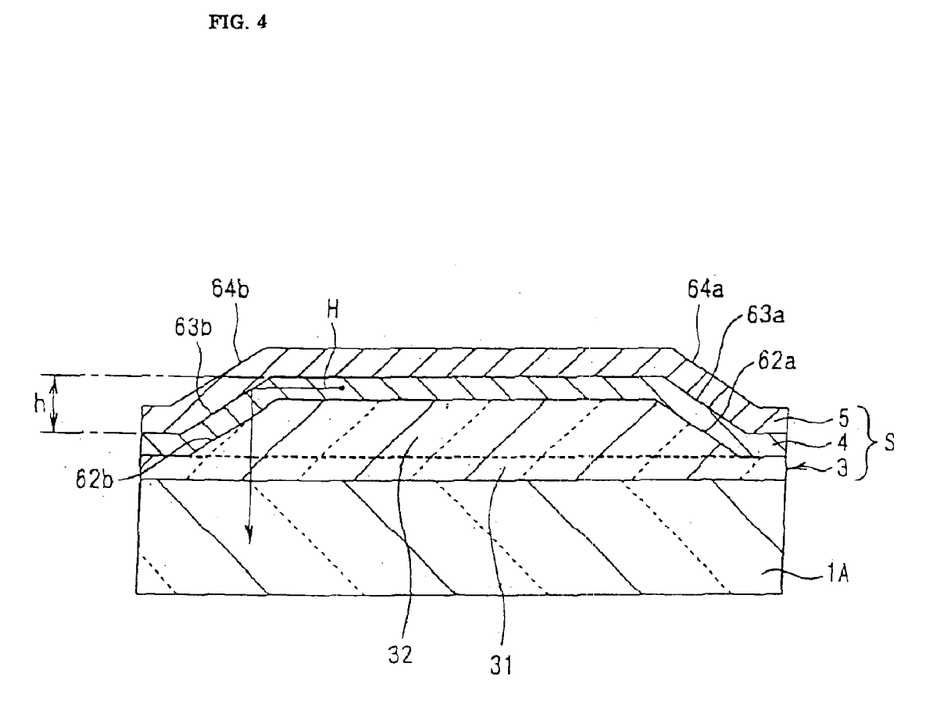
FIG. 4 is a sectional view showing a configuration of the organic electroluminescence display in accordance with the third embodiment taken along plane A—A of FIG. 1.

FIGS. 1 and 4 provide an explanation of an organic electroluminescence display corresponding to the third embodiment of the organic electroluminescence element of the present invention. FIG. 1 is a plan view showing an area (an area corresponding to the pixel region divided by the bank 17 in FIG. 11) of this organic electroluminescence display, and FIG. 4 is a sectional view taken along plane A—A of FIG. 1. FIG. 4 shows a glass substrate 1A in the state just before a cumulate body S is formed (a state where many kinds of driving elements are formed on the glass substrate, and the bank 17 is formed).

In this embodiment, slopes 62–64 of both electrode layers 3 and 5 and an organic luminous layer 4 are formed by making an anode layer (a light-transmissive electrode layer) 3 made of ITO ($In_2O_3$—$SnO_2$) in a shape having a convex section 32 corresponding to the slopes. The anode layer 3 is formed in the following method.

First, the first ITO thin film 31 is made by the sputtering method on the glass substrate 1A with a thickness of 100 nm. Next, on the first ITO thin film 31, a coating is formed by the spin coat method with a liquid made of an organic acid containing indium (In) and tin (Sn) (a liquid containing light-transmissive, conductive materials).

Next, by heating it at 100° C., solvent in this coating is removed, and the second ITO thin film is formed.

Next, by patterning and then baking the second ITO thin film, a convex section 32 is formed. These processes are performed so that the thickness of the convex section 32 after baking becomes 200 nm, for example. Also, this patterning is performed after forming a resist pattern on the second ITO thin film, and then by wet-etching it using an aqua-regia system etching liquid, for example.

By this patterning, rim sections of the pixel areas of the second ITO thin film are removed by the specified width so that four sides of the convex section 32, made of an ITO thin film, are made into slopes 62 in a tapered shape that becomes narrower the edges of the glass substrate 1A. As the result, four slopes 62 forming the sides of the convex section 32 are formed in the rim section of the pixel region. Here, in FIG. 4, which is a sectional view, only two slopes 62a and 62b are shown.

On an anode layer 3 having this convex section 32, an organic luminous layer 4 and a metallic cathode layer (a light-transmissive electrode layer) 5 are formed one by one. By this, slopes 63 and 64 are formed on the section of four slopes 62 of the convex section 32 on the organic luminous layer 4 and the cathode layer 5. These slopes 62–64 protrude from the anode layer 3 side to the cathode layer 5 side. Also, the slopes 62–64 are formed on the rim section side of the pixel region.

Here, in FIG. 4, which is a sectional view, only two slopes 63a, 64a, 63b, and 64b, are shown. In FIG. 1, which is a plan view, four slopes 64a–64d of the cathode layer 5 are shown.

The method of configuring and forming method of the organic luminous layer 4 and the cathode layer 5 are the same as those used in the first embodiment, except for setting the thickness of the organic luminous layer 4 to 100 nm. Specifically, in this embodiment, the thickness of the organic luminous layer 4 is set to 100 nm, and the thickness of the convex section 32 is set to 200 nm, which is larger than the thickness of the organic luminous layer 4. By this, the protruding height h of the organic luminous layer 4 by the slope 63 is set to be larger than the thickness of the organic luminous layer 4.

Therefore, according to the organic electroluminescence element of this embodiment, light H, generated in the organic luminous layer 4 and irradiated in parallel to the cumulate surface of the cumulate body S, is mainly reflected by the slope 63, which is a boundary between the cathode layer 5 and the organic luminous layer 4, and exits to the anode layer (a light-transmissive electrode layer) 3 side. By this, outgoing efficiency of light generated in the organic luminous layer 4 to the anode layer 3 side can be increased without decreasing the size of the aperture. Here, by setting slope 45° to 63°, the quantity of light that is reflected by this slope 63 and exits to the anode layer 3 side can be maximized.

Also, in this organic electroluminescence element, because both of the electrode layers 3 and 5 and the organic luminous layer 4 have slopes that extend over the entire surface in the pixel region, areas of the two electrode layers 3 and 5 and the organic luminous layer 4 increase, and the emission quantity increases by a corresponding amount compared with organic electroluminescence elements equipped with cumulate bodies whose entire surface of the cumulate layer is flat.

Further, in this embodiment, formation of the convex section 32, made of ITO, for providing slopes is performed by forming the first ITO film by the sputtering method, forming the second ITO film over it by the liquid coating method, and patterning this. Here, because the ITO film, formed by the liquid coating method, has a larger etching speed than the ITO film formed by the sputtering method, it is difficult for the underlying first ITO film to be overetched.

By this, the protruding height of the convex section 32 can be easily made to be the same with the thickness of the second ITO film. Therefore, by forming the second ITO film to the same thickness with the protruding height of the convex section 32, the protruding height of the convex section 32 can be easily controlled.

Thus, in this embodiment, although light is extracted from the ITO electrode side, which is the anode 3, another arrangement can also be provided where the anode and the cathode are switched. For example, even if a metallic anode with high light reflecting efficiency is used as the cathode layer 5 of this embodiment, and corresponding to this, even if a thin film metallic cathode with high light transmitting efficiency, for example, is used as the anode layer 3, light can be extracted efficiently as well.

Figure 5:
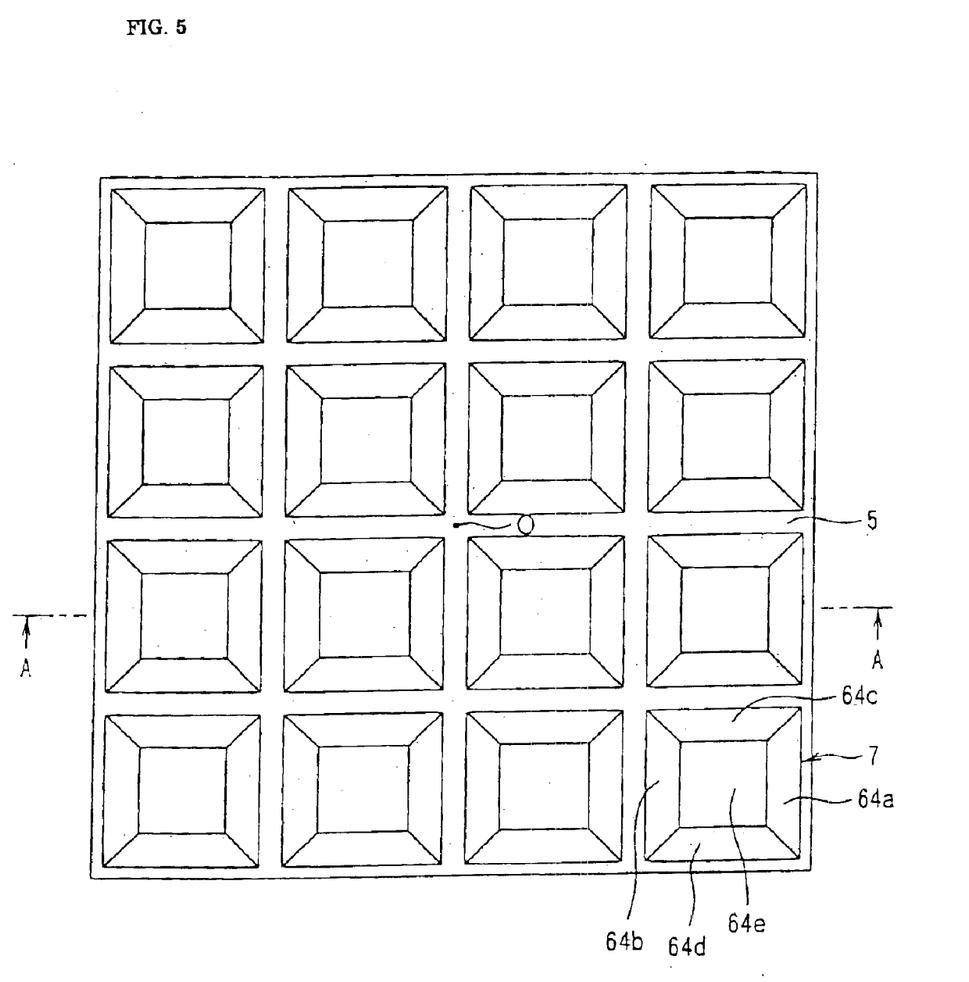
FIG. 5 is a plan view showing the interior of one pixel region of an organic electroluminescence display in accordance with a fourth embodiment of the invention.
Figure 6:
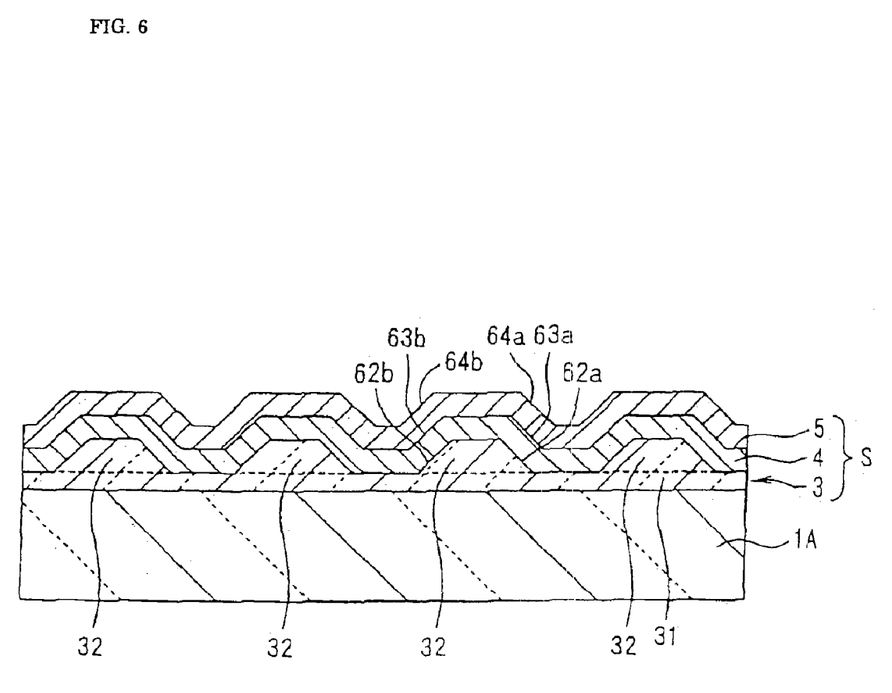
FIG. 6 is a sectional view showing a configuration of the organic electroluminescence display in accordance with the fourth embodiment taken along plane A—A of FIG. 5.

FIGS. 5 and 6 provide an explanation of an organic electroluminescence display corresponding to the fourth embodiment of the organic electroluminescence element of the present invention. FIG. 5 is a plan view showing an area (an area corresponding to the pixel region divided by the bank 17 in FIG. 11) of this organic electroluminescence display, and FIG. 6 is a sectional view taken along plane A—A of FIG. 1.

FIG. 6 shows a glass substrate 1A in the state just before a cumulate body S is formed (a state where many kinds of driving elements are formed on the glass substrate and the bank 17 is formed).

In this embodiment, in the same way as the third embodiment, slopes 62–64 of both electrode layers 3 and 5 and an organic luminous layer 4 are formed by making an anode layer (a light-transmissive electrode layer) 3, made of ITO ($In_2O_3$—$SnO_2$) in a shape having a convex section 32 corresponding to the slopes. However, while one convex section 32 is formed in one pixel region in the third embodiment, sixteen convex sections 32 are formed in one pixel region in this embodiment. The remainder of the configuration is the same as with the third embodiment.

Specifically, in this embodiment, patterning of the second ITO film is performed so that sixteen convex sections 32, having four slopes 62, are formed in a rotational symmetry centering on a central point O of one pixel region. Then, on the anode layer 3 having these convex sections 32, an organic luminous layer 4 and a metallic cathode layer (a light-reflective electrode layer) 5 are formed one by one.

Thus, slopes 63 and 64 are formed on the section of four slopes 62 of the convex section 32 on the organic luminous layer 4 and the cathode layer. The slopes 62–64 protrude from the anode layer 3 side to the cathode layer 5 side. Also, as shown in FIG. 5, if one pixel region of this display is viewed from the cathode layer 5 side, sixteen projections 7 having four slopes 64a–64d of the cathode layer 5, as its sides, and one plane 64e, as its top, are formed in a rotational symmetry centering on the central point O of one pixel region.

Namely, in this embodiment, 16×4 sets of slopes are arranged uniformly in the surface of one pixel region. By this, slopes 63, which reflect light generated in the organic luminous layer 4 and irradiated in parallel with the cumulate surface of the cumulate body S to enable it to travel toward the anode layer 3 side, are arranged uniformly in the surface of one pixel region.

Therefore, this embodiment provides an effect that uniformity of brightness inside one pixel region becomes higher compared with the third embodiment where slopes are only formed in the rim section sides of one pixel region.

Figure 7:
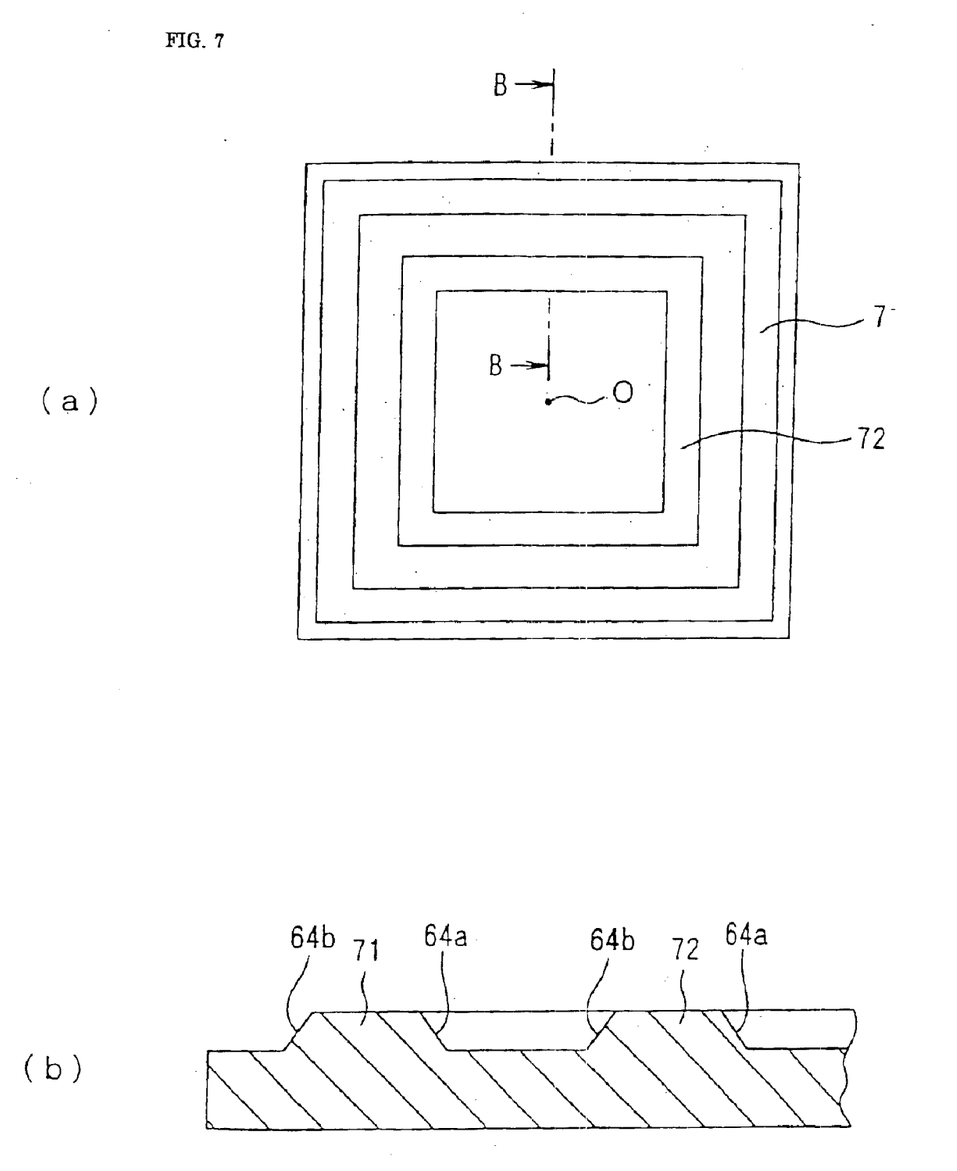
Figure 8:
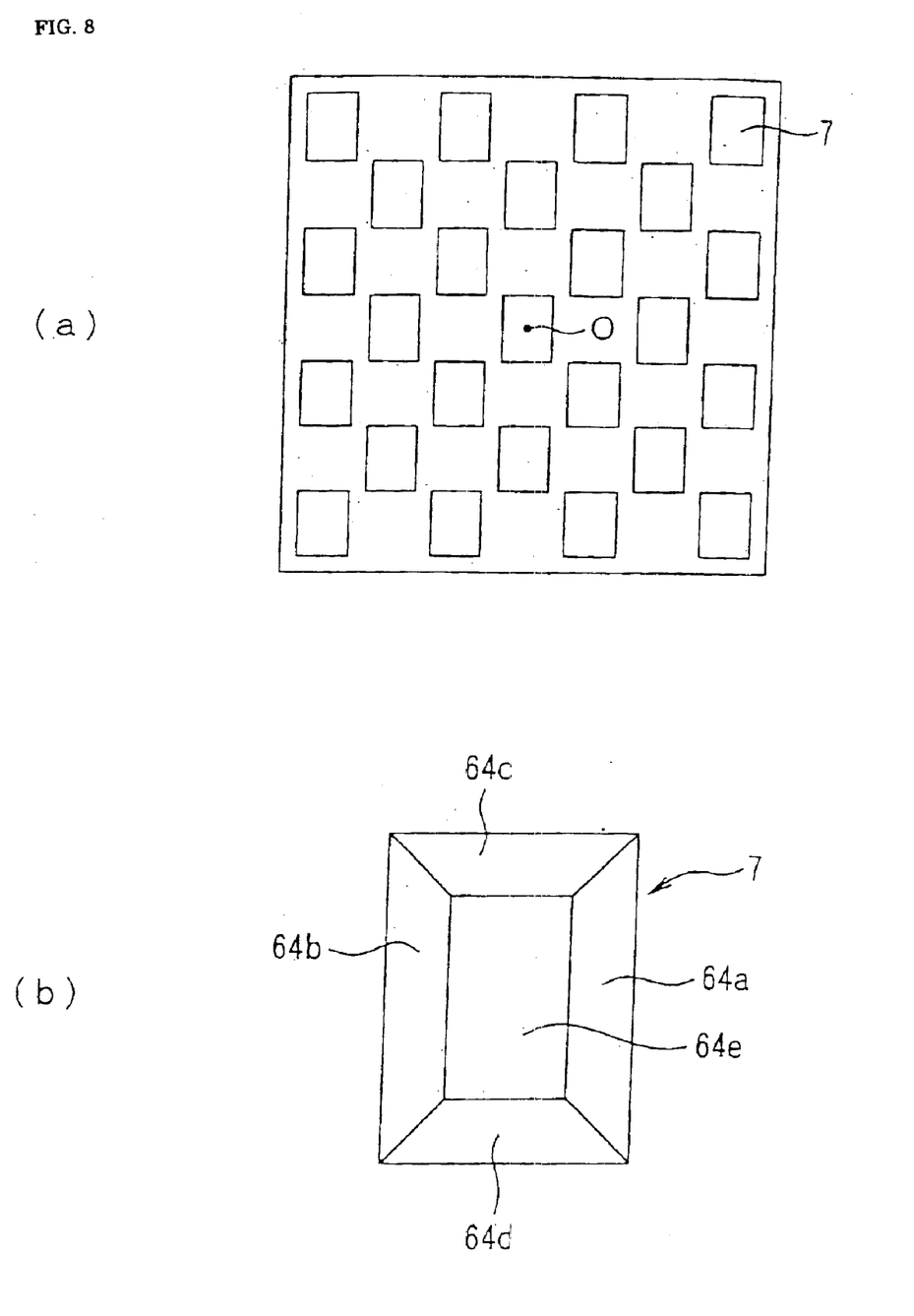

FIGS. 7(a)–8(b) show methods of arranging plural number of slopes uniformly in the surface of one pixel region, which are different from the example shown in FIG. 5. FIG. 7(a) is a plan view showing an example of the arrangement method, and FIG. 7(b) is a sectional view taken along plane B—B of FIG. 7(a). FIG. 8(a) is a plan view showing an example of the arrangement method, and FIG. 8(b) is a blown-up view showing the details of a projection 7 in FIG. 8(a).

In the arrangement in FIGS. 7(a) and 7(b), and as specifically shown in FIG. 7(a), a frame-shape projection 71, formed with a specified width including two similar squares forming a pixel region, is installed in the rim section of the pixel region, and a similar frame-shape projection 72 is installed inside projection 71. In this case, as shown in FIG. 7(b), four slopes 64a and 64b are defined by projections 71 and 72 between a central point O and the rim section of one pixel region.

Here, because FIG. 7(b) is a sectional view of one body of the cumulate body S and the glass substrate 1A, only the slopes 64a and 64b of the cathode layer 5 on the very top are shown.

In the arrangement in FIGS. 8(a) and 8(b), sixteen projections 7 having four slopes 64a–64d of the cathode layer 5, as its sides, and one plane 64e, as its top, are formed in a rotational symmetry centering on the central point O of one pixel region. The planar shape of the projection 7 is not limited to a rectangle, as is shown, or a square in FIG. 5, and instead can be a circle, etc. If the case where the planar shape of the projection 7 is a circle is compared with the case where it is a rectangle or a square, the circle case has higher uniformity of brightness within one pixel region.

Here, although the cumulate body in each of the embodiments includes a light-transmissive electrode layer on the substrate side, an organic electroluminescence element equipped with a cumulate body having a light reflecting electrode layer on the substrate side is also included in the present invention. In an electroluminescence element equipped with a cumulate body having a light-reflective electrode layer on the substrate side, when installing a projection, made of an insulating material, between the electrode layer on the substrate side and the substrate, this projection does not need to be light-transmissive.

Also, although an explanation is provided with regard to an organic electroluminescence display in each of the embodiments, the present invention is not limited to this, but can be applied to other organic electroluminescence elements, such as planar light source. In the case of a planar light source, it is effective to increase uniformity of brightness within the luminous layer by forming multiple slopes uniformly arranged in the luminous surface, as in the fourth embodiment.

Furthermore, whether the driving method of an organic electroluminescence display is the active matrix method or the passive matrix method, the present invention can be applied optimally. In the case of the passive matrix method, because the overlapping part of the two electrode layers becomes the pixel region, in the part where the two electrode layers overlap, a slope protruding from the light-transmissive electrode layer side to the light reflecting electrode layer side.

As explained above, according to the organic electroluminescence element of the present invention, in an organic electroluminescence element equipped with a cumulate body having a cathode layer, an anode layer, and an organic luminous layer between the two electrode layers where one electrode layer is light-transmissive and the other electrode layer is light-reflective, outgoing efficiency of light generated in the organic luminous layer can be increased without decreasing the numerical aperture.

As a result, an organic electroluminescence element that has a high brightness and is superior to conventional technology in low electricity consumption can be obtained.

Also, according to the manufacturing method of the present invention, the organic electroluminescence element of the present invention can be manufactured easily.

What is claimed is:

1. An organic electroluminescence element, comprising:
   a first electrode layer;
   a second electrode layer; and
   at least one organic thin film layer containing an organic luminous layer disposed between the first electrode layer and the second electrode layer,
   the first electrode layer, the second electrode layer and the organic luminous layer forming a cumulate body with a flat surface,
   the first and second electrode layers having slopes that are arranged substantially around the flat surface,
   at least one of the first and second electrode layers being formed on a convex section, and
   a light generated in the organic layer being reflected by the slope of the second electrode layer and going out to the side of the first electrode layer.

2. An organic electroluminescence element comprising:
   a first electrode layer;
   a second electrode layer; and
   at least one organic thin film layer containing an organic luminous layer disposed between the first electrode layer and the second electrode layer,
   the first electrode layer, the second electrode layer and the organic luminous layer forming a cumulate body with a flat surface,
   the first and second electrode layers having slopes that are arranged substantially around the flat surface,
   the slopes being formed on rim sides of a pixel, and
   the slopes falling outwardly from a pixel region.

3. The organic electroluminescence element according to claim 1, the slopes being disposed such that a protruding height of the organic luminous layer is larger than a thickness of the organic luminous layer.

4. The organic electroluminescence element according to claim 1, the slopes being disposed such that a protruding height of the organic luminous layer by the slopes is larger than a total value of a thickness of the first electrode layer and a thickness of the organic luminous layer, or a total value of a thickness of the second electrode layer and the thickness of the of the organic luminous layer.

5. The organic electroluminescence element according to claim 1, the slopes including multiple slopes that are uniformly arranged.

6. The organic electroluminescence element according to claim 1, the slopes being formed by providing a projection, made of an insulating material, on a substrate forming a cumulate body of the organic electroluminescence element.

7. The organic electroluminescence element according to claim 1, the slopes being defined by forming projections on at least one of the first electrode layer and the second electrode layer, the projections corresponding to the slopes.

8. The organic electroluminescent element according to claim 1,
   the first electrode layer being light-transmissive, and the second electrode having light-reflectivity.

9. An organic electroluminescent display comprising the organic electroluminescent element according to claim 1.

10. The organic electroluminescent element according to claim 1,
    the first electrode layer being an anode layer, and the second electrode layer being a cathode layer.

* * * * *